(12) United States Patent
Takemoto et al.

(10) Patent No.: US 7,608,787 B2
(45) Date of Patent: Oct. 27, 2009

(54) SEMICONDUCTOR MEMORY DEVICE AND USB MEMORY DEVICE USING THE SAME

(75) Inventors: Yasuo Takemoto, Yokohama (JP); Naohisa Okumura, Yokohama (JP); Taku Nishiyama, Yokohama (JP); Takashi Okada, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 352 days.

(21) Appl. No.: 11/531,589

(22) Filed: Sep. 13, 2006

(65) Prior Publication Data
US 2007/0066102 A1    Mar. 22, 2007

(30) Foreign Application Priority Data
Sep. 16, 2005    (JP) .............................. 2005-270991
Feb. 7, 2006     (JP) .............................. 2006-029220

(51) Int. Cl.
H05K 1/16    (2006.01)
(52) U.S. Cl. ........................................ 174/260; 361/737
(58) Field of Classification Search ................. 174/260; 361/686, 737, 727; 439/351–353, 607
See application file for complete search history.

(56) References Cited
U.S. PATENT DOCUMENTS

| | | | |
|---|---|---|---|
| 6,985,363 B2* | 1/2006 | Yagi et al. .................... | 361/760 |
| 7,269,004 B1* | 9/2007 | Ni et al. ........................ | 361/686 |
| 7,352,588 B2* | 4/2008 | Nishizawa et al. .......... | 361/737 |
| 2004/0153595 A1 | 8/2004 | Sukegawa et al. | |
| 2007/0245047 A1* | 10/2007 | Chung et al. .................. | 710/74 |

FOREIGN PATENT DOCUMENTS

| | | |
|---|---|---|
| DE | 102 33 428 A1 | 11/2003 |
| JP | 2003-331249 | 11/2003 |

OTHER PUBLICATIONS

U.S. Appl. No. 11/719,368, filed May 15, 2007, Okumura.

* cited by examiner

*Primary Examiner*—Dean A. Reichard
*Assistant Examiner*—Yuriy Semenenko
(74) *Attorney, Agent, or Firm*—Oblon, Spivak, McClelland, Maier & Neustadt, L.L.P.

(57) ABSTRACT

A USB terminal having a conductor layer to be an input/output terminal of a USB connector is formed on a first principle surface of a circuit board. A memory element is mounted on a second principle surface at an opposite side of a terminal forming surface of the circuit board, and the memory element is sealed with a sealing resin. A semiconductor memory device as a USB memory main body is constituted by them. A USB memory is constituted by housing the USB memory main body inside of a USB connector case.

21 Claims, 10 Drawing Sheets

SEMICONDUCTOR MEMORY DEVICE AND USB MEMORY DEVICE USING THE SAME

CROSS-REFERENCE TO THE INVENTION

This application is based upon and claims the benefit of priority from the prior Japanese Patent Application No. 2005-270991, filed on Sep. 16, 2005 and Japanese Patent Application No. 2006-29220, filed on Feb. 7, 2006; the entire contents of which are incorporated herein by reference.

BACKGROUND OF THE INVENTION

1. Field of the Invention

The present invention relates to a semiconductor memory device and a USB memory device using the same.

2. Description of the Related Art

A USB memory in which a flash memory and a USB (Universal Serial Bus) connector are integrated has characteristics that it is excellent at connectivity with various devices, writability of information, portability, and so on, and further has a large storage capacity in itself. The USB memory becomes common rapidly from the points as stated above, as storage media of a PC (Personal Computer), peripheral devices thereof, a communication device and an audio player in portable type, an HDD (Hard Disk Drive) recorder, a DVD (Digital Video Disk) recorder, and so on. The USB memory generally has a structure in which a USB connector component and a circuit board on which a flash memory is mounted are connected to be integrated.

The USB connector component has a structure in which components holding a metal terminal as an input/output terminal by a resin board are arranged inside of a metal case (USB connector case) to be plugged into a USB port. On the other hand, electronic components such as a capacitor, a resistance, a quartz oscillator are surface mounted on the circuit board together with an IC package including a memory element and a controller element. It is impossible to miniaturize the USB memory connecting and integrating those less than a size in which a size of the USB connector component is added to a substrate size mounting each component. In particular, the IC package is larger than the other components, and therefore, the size thereof prevents the miniaturization of the circuit board, and further, the miniaturization of the USB memory.

The USB memory is used by plugged into the USB ports of the PC, the peripheral devices thereof, and so on. Consequently, a connecting portion and so on are easy to be damaged only by adding a slight force in an unnecessary direction if the USB memory in itself is large. It is therefore studied to make the USB memory miniaturize further more. For example, a USB memory in which an input/output terminal of a USB connector is provided at one end side of a circuit board, and a memory element and a controller element are mounted on a terminal providing surface of the circuit board is described in JP-A 2003-331249 (KOKAI). However, the memory element and the controller element are mounted as an IC package, and a structure as same as a memory card is adopted. It is difficult to fully miniaturize the conventional USB memory, and the USB memory as described above is also the same.

A USB memory in which an input/output terminal of a USB connector is arranged at an upper surface side of a circuit board arranged inside of a USB connector case, and a semiconductor device having a memory element and a controller element is arranged at an lower surface side of the circuit board is described in a US 2004/0153595 A1. Here, a multi chip package is created by mounting the memory element and the controller element on a substrate, and this is mounted at the lower surface side of the circuit board on which the input/output terminal is provided. It is inevitable that a thickness and a size of the multi chip package in itself including the memory element and the controller element become large. Consequently, there is a possibility that the size of the multi chip package in itself becomes an obstacle to mount it on the circuit board arranged inside of the USB connector case.

SUMMARY OF THE INVENTION

A semiconductor memory device according to an aspect of the present invention, including: a circuit board having a first principle surface and a second principle surface at an opposite side of the first principle surface; a USB terminal formed on the first principle surface of the circuit board, and having a conductor layer to be an input/output terminal of a USB connector; a memory element mounted on the second principle surface of the circuit board; and a sealing resin provided on the second principle surface of the circuit board so as to seal the memory element.

A USB memory device according to another aspect of the present invention, including: a semiconductor memory device, including: a circuit board having a first principle surface and a second principle surface at an opposite side of the first principle surface; a USB terminal formed on the first principle surface of the circuit board, and having a conductor layer to be an input/output terminal of a USB connector; a memory element mounted on the second principle surface of the circuit board; and a sealing resin provided on the second principle surface of the circuit board so as to seal the memory element, and a USB connector case to which at least a part of the semiconductor memory device is housed.

DESCRIPTION OF THE EMBODIMENTS

Hereinafter, embodiments of the present invention are described with reference to the drawings. Incidentally, the embodiments of the present invention are described in the following based on the drawings, but these drawings are provided only for an illustrative purpose and by no means are intended to limit the present invention.

Figure 1:
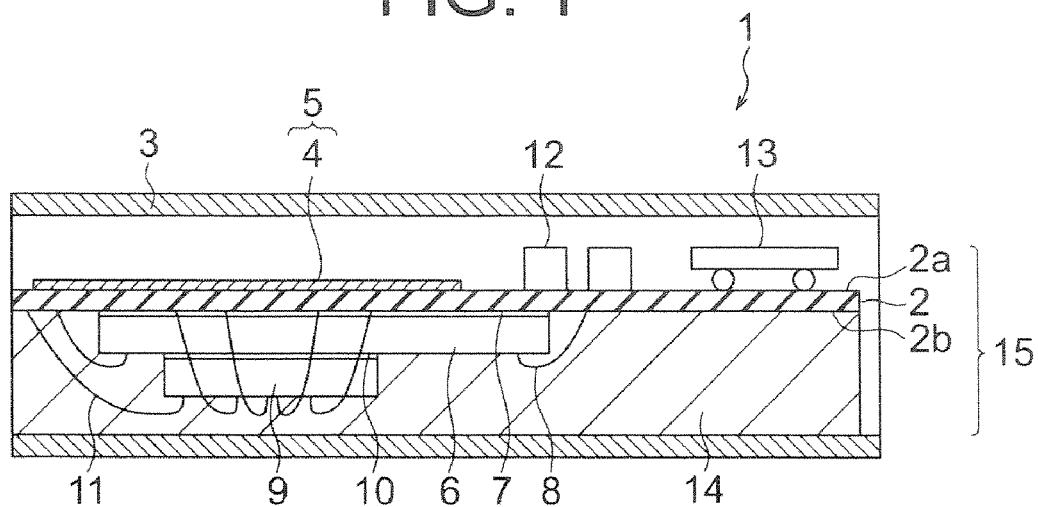
FIG. 1 is a sectional view showing a constitution of a USB memory device according to a first embodiment of the present invention
Figure 2:
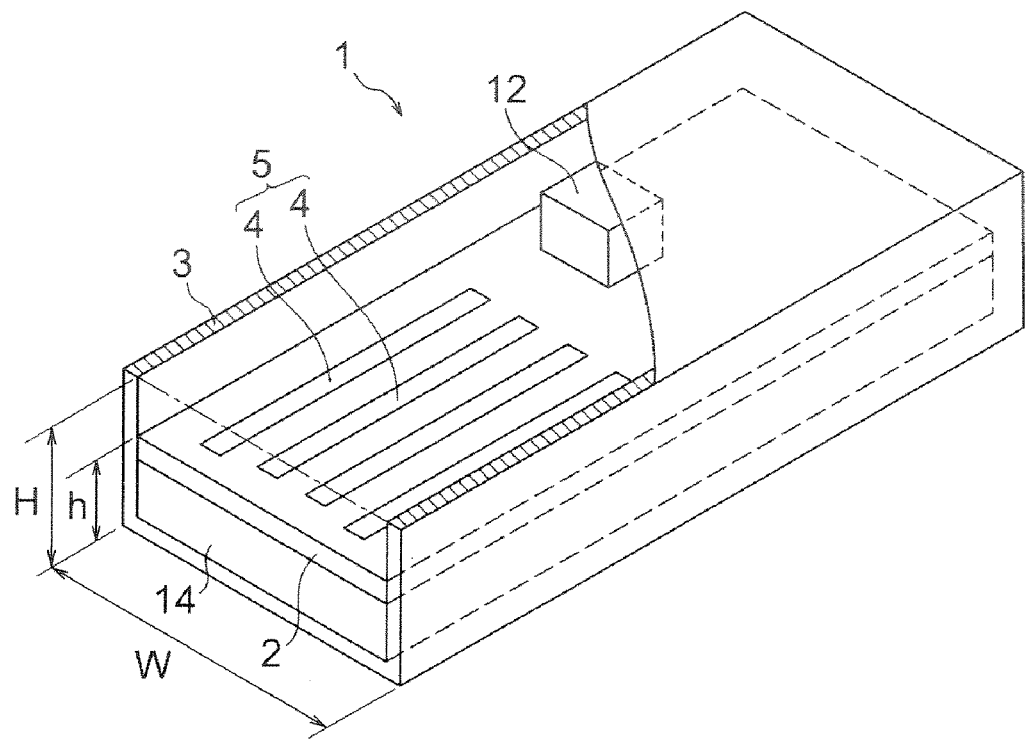
FIG. 2 is a perspective view showing the constitution of the USB memory device according to the first embodiment of the present invention by cutting out a part thereof.

FIG. 1 and FIG. 2 are views showing a constitution of a USB memory device according to a first embodiment of the present invention. FIG. 1 is a sectional view (longitudinal sectional view) along a longitudinal direction of the USB memory device, and FIG. 2 is a perspective view showing the USB memory device by cutting out a part thereof. A USB memory 1 shown in these views has a circuit board 2 combining both a terminal forming substrate and a mounting substrate of a memory element and so on. The circuit board 2 has a width insertable into a later-described USB connector case 3. In other words, the width of the circuit board 2 is set based on a size of the USB connector case 3.

The circuit board 2 includes a first principle surface 2a to be a terminal forming surface and a second principle surface 2b at an opposite side of the first principle surface 2a. The circuit board 2 is the one in which a wiring network (not shown) constituted by internal wiring and surface wiring is provided on various insulating substrates such as a resin substrate, a ceramic substrate, a glass substrate, and so on. Concretely speaking, a printed circuit board using a glass-epoxy resin, a BT resin (Bismaleimide-Triazine resin), and so on can be applied.

A conductor layer 4 to be an input/output terminal of a USB connector is formed on the first principle surface 2a of the circuit board 2. Namely, in the USB memory 1 of the embodiment, a USB terminal 5 constituting the USB connector is provided on the first principle surface 2a of the circuit board 2 by forming the conductor layer 4 based on a USB standard. The conductor layer 4 is formed by a plating method and so on. The conductor layer 4 constituting the USB terminal 5 is electrically connected to the wiring network of the circuit board 2.

A memory element 6 such as a NAND type flash memory is mounted on the second principle surface (rear surface) 2b at the opposite side of the first principle surface (terminal forming surface/ front surface) 2a of the circuit board 2 on which the USB terminal 5 as stated above is provided. The memory element 6 is bare chip mounted on the second principle surface 2b of the circuit board 2. Namely, the memory element 6 is adhered on the second principle surface 2b of the circuit board 2 via, for example, a film insulating adhesive 7 in a state of a bare chip.

Further, the memory element 6 is electrically connected to a connection pad (not shown) of the circuit board 2 via bonding wires 8. Incidentally, a state in which one memory element 6 is mounted is shown in FIG. 1 and FIG. 2, but plural memory elements 6 may be stacked and mounted on the second principle surface 2b of the circuit board 2. The number of the memory elements 6 mounted on the circuit board 2 is properly set in accordance with a storage capacity of each element, a setting capacity of the USB memory 1, and so on. A controller element 9 is adhered on the memory element 6 via, for example, a film insulating adhesive 10.

Figure 3:
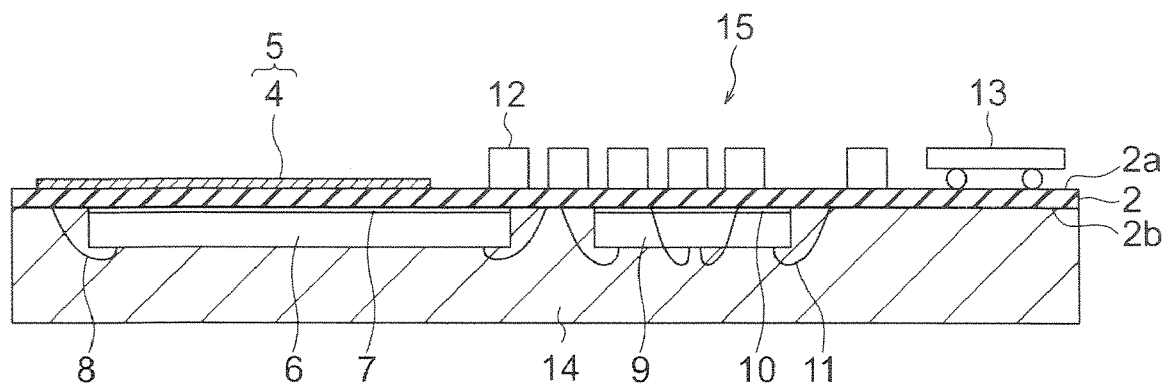
FIG. 3 is a sectional view showing a modification example of a main body portion of the USB memory device shown in FIG. 1.
Figure 4:
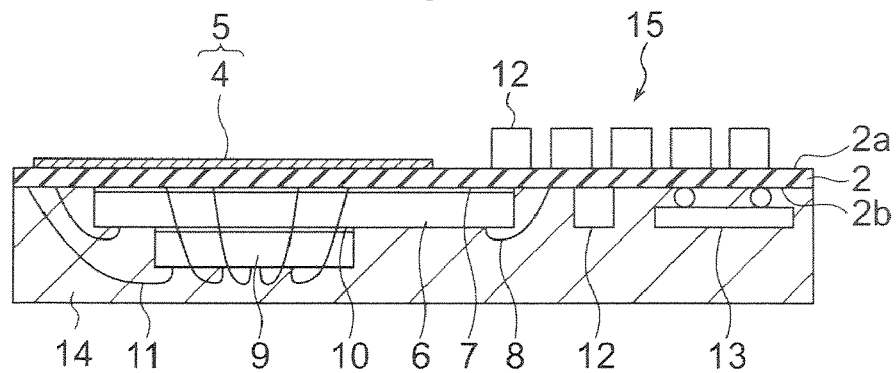
FIG. 4 is a sectional view showing another modification example of the main body portion of the USB memory device shown in FIG. 1.
Figure 5:
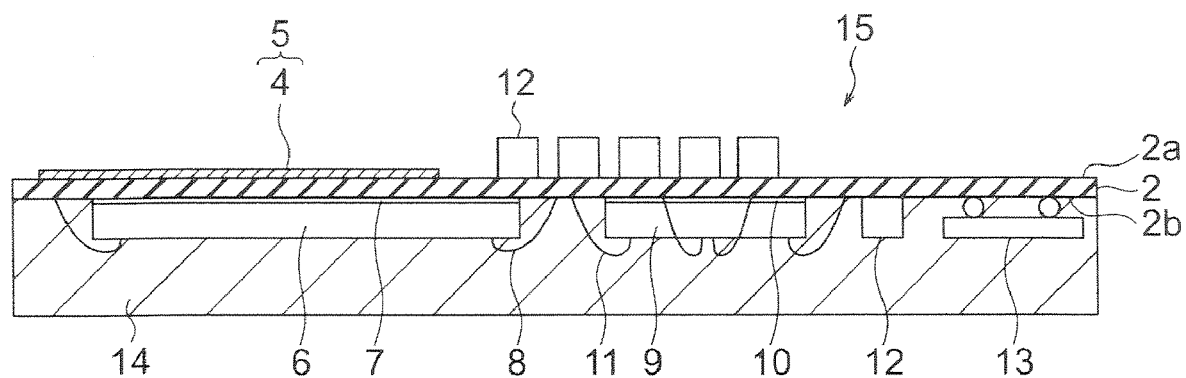
FIG. 5 is a sectional view showing still another modification example of the main body portion of the USB memory device shown in FIG. 1.

The controller element 9 is electrically connected to the memory element 6 and the connection pad of the circuit board 2 via bonding wires 11 The controller element 9 performs a writing of data received via the USB terminal 5 to the memory element 6, a reading of data stored in the memory element 6, and so on, and has a USB interface portion, a buffer portion, a memory control portion, and so on. The controller element 9 may be, for example, directly mounted on the second principle surface 2b of the circuit board 2 so as to be parallel arranged with the memory element 6 as shown in FIG. 3. In FIG. 3, only a semiconductor memory device as a main body portion of the USB memory 1 is shown. FIG. 4 and FIG. 5 are the same.

Electronic components required for constituting the USB memory 1 such as electronic components 12 such as a capacitor and a resistance, a BGA type electronic component 13, and soon are mounted on a substrate region except a forming region of the USB terminal 5 on the first principle surface 2a of the circuit board 2. A part of these electronic components 12, 13 may be mounted, for example, on the second principle surface 2b of the circuit board 2 being a mounting surface of the memory element 6, as shown in FIG. 4 and FIG. 5. The electronic components 12, 13 are mounted on at least one of a region except the terminal forming region of the first principle surface 2a and a region except the element mounting region of the second principle surface 2b. The electronic components 12, 13 may be mounted on either of these regions.

A sealing resin 14 such as an epoxy resin is mold formed on the second principle surface 2b of the circuit board 2 on which the memory element 6 and the controller element 9 are mounted. Namely, the memory element 6, the controller element 9, and further, a part of the electronic components 12, 13 mounted on the second principle surface 2b are sealed by the sealing resin 14. As stated above, a semiconductor package using the circuit board 2 on which the USB terminal 5 is formed, is formed by integrally sealing the memory element 6 and the controller element 9 directly mounted on the second principle surface 2b of the circuit board 2 with the sealing resin 14. A semiconductor memory device as a USB memory main body 15 is constituted by them.

As stated above, it becomes possible to drastically miniaturize sizes of the circuit board 2 and the USB memory main body (semiconductor memory device) 15 by directly mounting the memory element 6 and the controller element 9 on the surface (second principle surface 2b) at an opposite side of the terminal forming surface (first principle surface 2a) of the circuit board 2 on which the USB terminal 5 is formed. Further, it becomes possible to reduce the number of components. In addition, the sealing resin 14 is mold formed at the second principle surface 2b side of the circuit board 2, a package is formed by sealing the respective elements 6, 9, and it becomes possible to ensure the compatibility of the miniaturization and a high reliability of the USB memory main body 15.

The USB memory main body 15 is inserted into a USB connector case 3, and the USB memory 1 is constituted by them. The USB connector case 3 has a width W and a height H based on a connector standard of a USB. These sizes are the same as a connector case in a conventional USB connector component. In other words, a circuit board mounting an IC package including a memory element, a controller element, and so on is required in addition to the USB connector component in the conventional USB memory, but the USB memory 1 according to the present embodiment constitutes the whole device only with the size of the conventional USB connector component.

The height h of the USB terminal 5 formed on the first principle surface 2a of the circuit board 2 is adjusted so as to reach a height of the USB connector when the circuit board 2 is housed in the USB connector case 3. Concretely speaking, the sealing resin 14 has a thickness in which the height h of the USB terminal 5 can secure the height of the USB connector. As stated above, the thickness of the sealing resin 14 is adjusted while considering the thickness of the circuit board 2, and thereby, it becomes possible to provide the USB terminal 5 with a function as the USB connector.

The USB memory 1 of the present embodiment houses the USB memory main body 15 inside of the USB connector case 3, and the whole device is constituted with the size of this USB connector case 3. Consequently, it becomes possible to drastically miniaturize the size according to the USB memory 1 compared to the conventional USB memory. The miniaturization of the USB memory 1 contributes to a reduction of a manufacturing cost based on, for example, a miniaturization and so on of the circuit board 2, in addition to improvements in a connection reliability with a USB port of a device side, a portability and so on. Namely, according to the present embodiment, it becomes possible to provide the USB memory 1 realizing the miniaturization and a low cost, and being excellent at a practicality, a convenience, a reliability, and so on.

The USB memory 1 of the first embodiment has the constitution in which all or a part of the USB memory main body (semiconductor memory device) 15 is housed inside of the USB connector case 3. Here, there is a possibility that the USB memory main body 15 moves forward and backward or up and down, only by just inserting the USB memory main body 15 into the USB connector case 3. The USB memory main body 15 may be fixed to the USB connector case 3 with an adhesive and so on, but a USB memory 1 applying more simple move preventing mechanism is descried with reference to FIG. 6 to FIG. 11.

Figure 6:
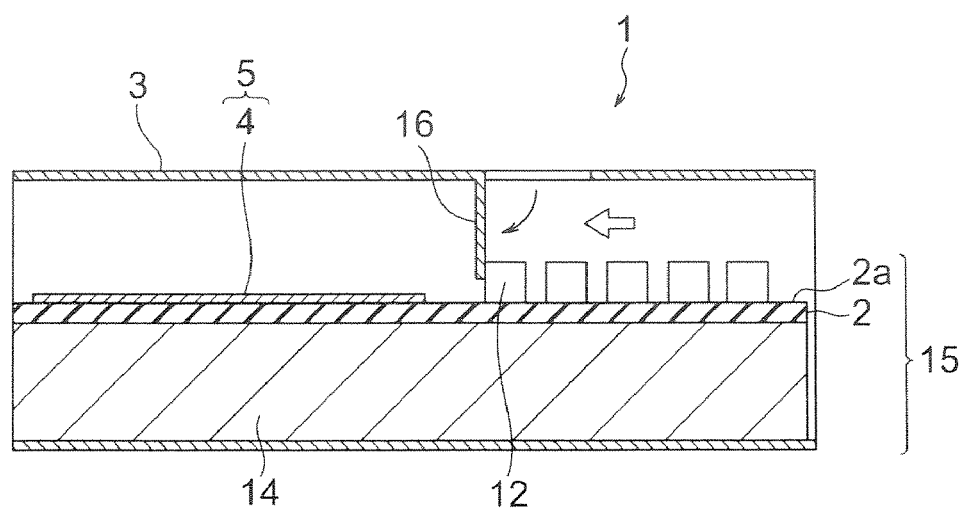
FIG. 6 is a sectional view showing a constitution of a USB memory device according to a second embodiment of the present invention.

FIG. 6 is a longitudinal sectional view showing a constitution of a USB memory 1 according to a second embodiment of the present invention. It is the same as the first embodiment in a point that a USB memory main body 15 is housed inside of a USB connector case 3 to thereby constitute the USB memory 1,and a concrete constitution thereof are as stated above. Incidentally, a memory element 6, a controller element 9, and so on are not shown in FIG. 6, but the memory element 6, the controller element 9, and a part of electronic components 12, 13 if required are arranged inside of a sealing resin 14 mold formed on a second principle surface 2b of a circuit board 2 as same as in FIG. 1 to FIG. 5. Namely, a numeric symbol 14 in FIG. 6 shows an SiP (System in Package) having the memory element 6 and the controller element 9. It is also the same in FIG. 7 to FIG. 19.

In the USB memory 1 shown in FIG. 6, a part of an upper surface of the USB connector case 3 (a surface facing with a first principle surface 2a of the circuit board 2) is cut in U-shape. A projection 16 is formed by folding this cut portion toward the first principle surface 2a of the circuit board 2. A downward length of the projection 16 is set to overlap with a height of the electronic component 12. The projection 16 of the USB connector case 3 is brought into contact with a side surface of the electronic component 12 when the USB memory main body 15 is inserted into the USB connector case 3 from an end portion (front end portion) having a USB terminal 5. Herewith, a movement forward of the USB memory main body 15 can be prevented.

Figure 7:
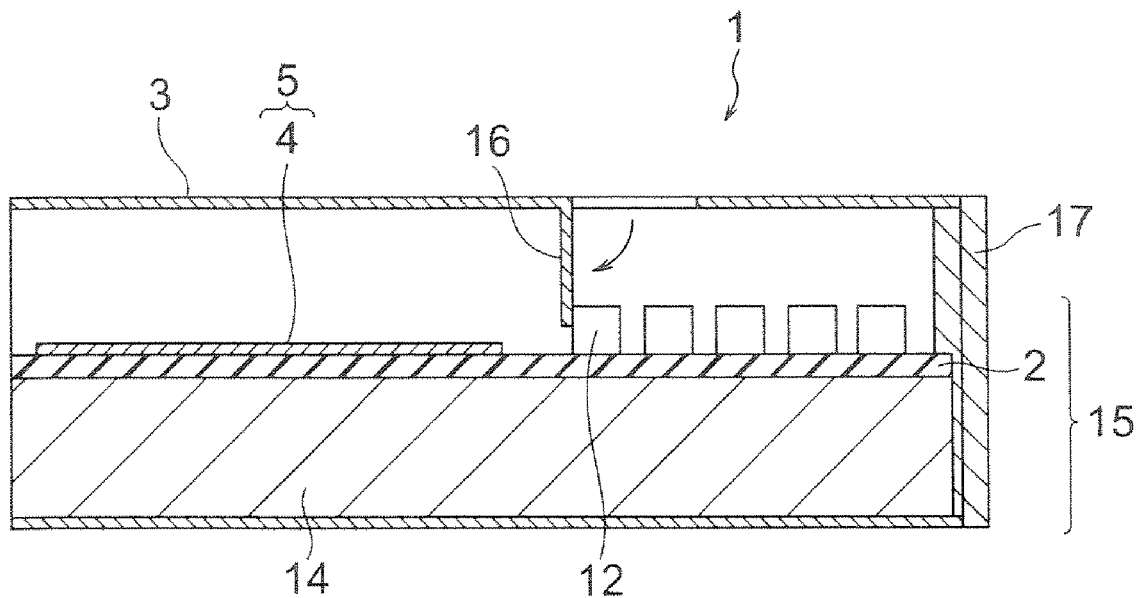
FIG. 7 is a sectional view showing another constitution of the USB memory device according to the second embodiment of the present invention.

Incidentally, the component with which the projection 16 of the USB connector case 3 is in contact is not limited to the actually working electronic component 12, but it may be a dummy electronic component. The projection 16 is brought into contact with the dummy electronic component, and thereby, a reliability of the USB memory 1 can be enhanced. As for a rear side of the USB memory main body 15, for example, a casing member 17 is attached at a rear side end portion of the USB connector case 3 as shown in FIG. 7. Herewith, movements backward and in longitudinal direction of the USB memory main body 15 can be prevented.

Figure 8:
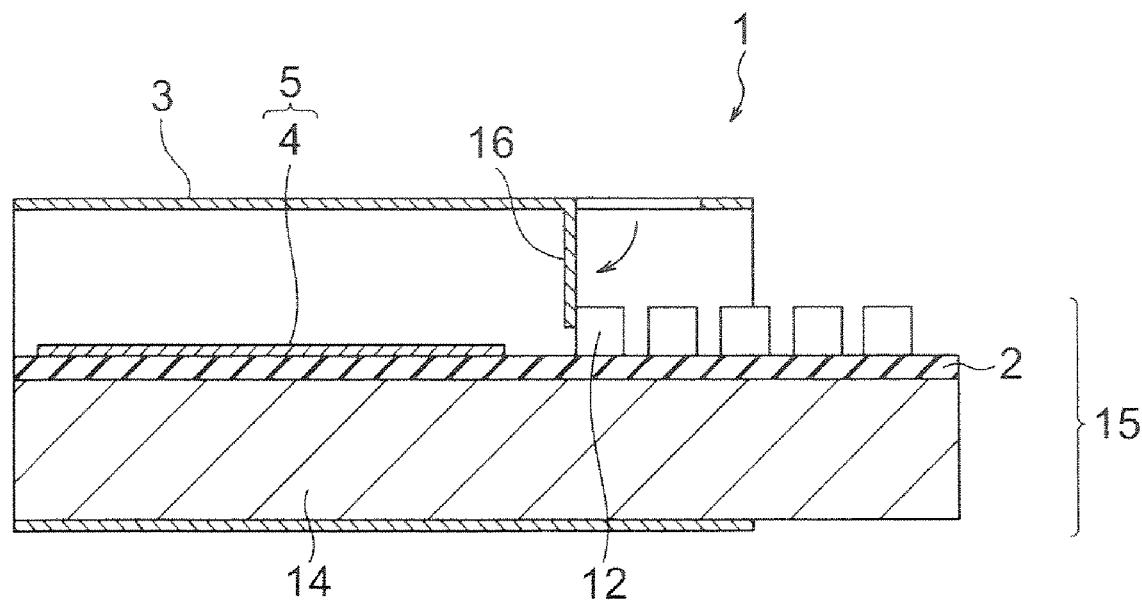
FIG. 8 is a sectional view showing a modification example of the USB memory device shown in FIG. 6.

In the above-stated respective embodiments, examples are described in which the USB connector case 3 capable of housing the whole USB memory main body 15 is used, but the USB connector case 3 is not limited to this. For example, as shown in FIG. 8, the USB connector case 3 may be the one housing only a part of the USB memory main body 15. The USB connector case 3 is good enough as long as it can house at least a portion of the USB terminal 5. When a part of the USB memory main body 15 is exposing from the USB connector case 3, this exposing portion may be held by a mold resin or housed in an external case.

Figure 9:
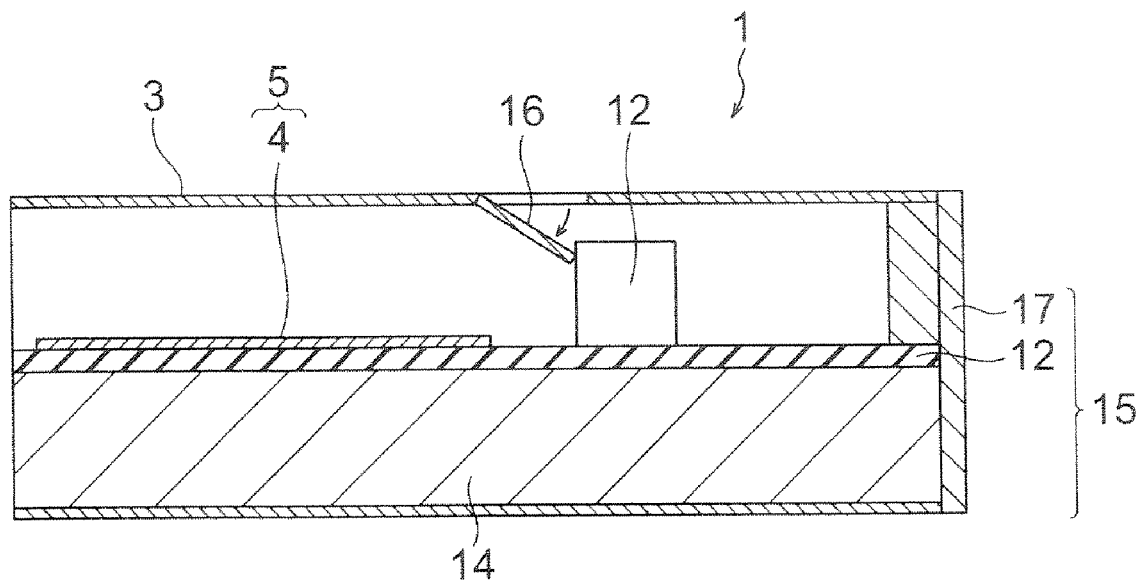
FIG. 9 is a sectional view showing another modification example of the USB memory device shown in FIG. 6.

FIG. 6 and FIG. 7 show the projection 16 formed by folding the cut portion of the USB connector case 3 for approximately 90 degrees relative to a lower side. A shape of the projection 16 is not limited to this. For example, as shown in FIG. 9, an folding angle of the cut portion of the USB connector case 3 is made to be an acute angle to project the projection 16 obliquely. Such projection 16 is excellent in intensity when it is brought into contact with the electronic component 12, and therefore, it becomes possible to more certainly prevent the USB memory main body 15 from falling off caused by a damage and so on of the projection 16

Figure 10:
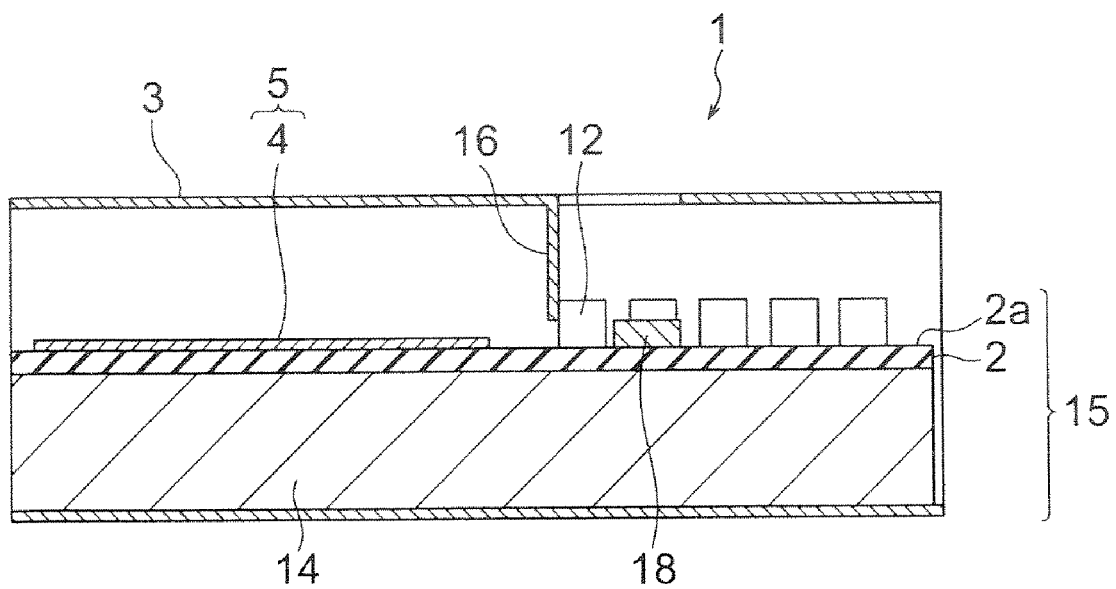
FIG. 10 is a sectional view showing still another constitution of the USB memory device according to the second embodiment of the present invention.
Figure 11:
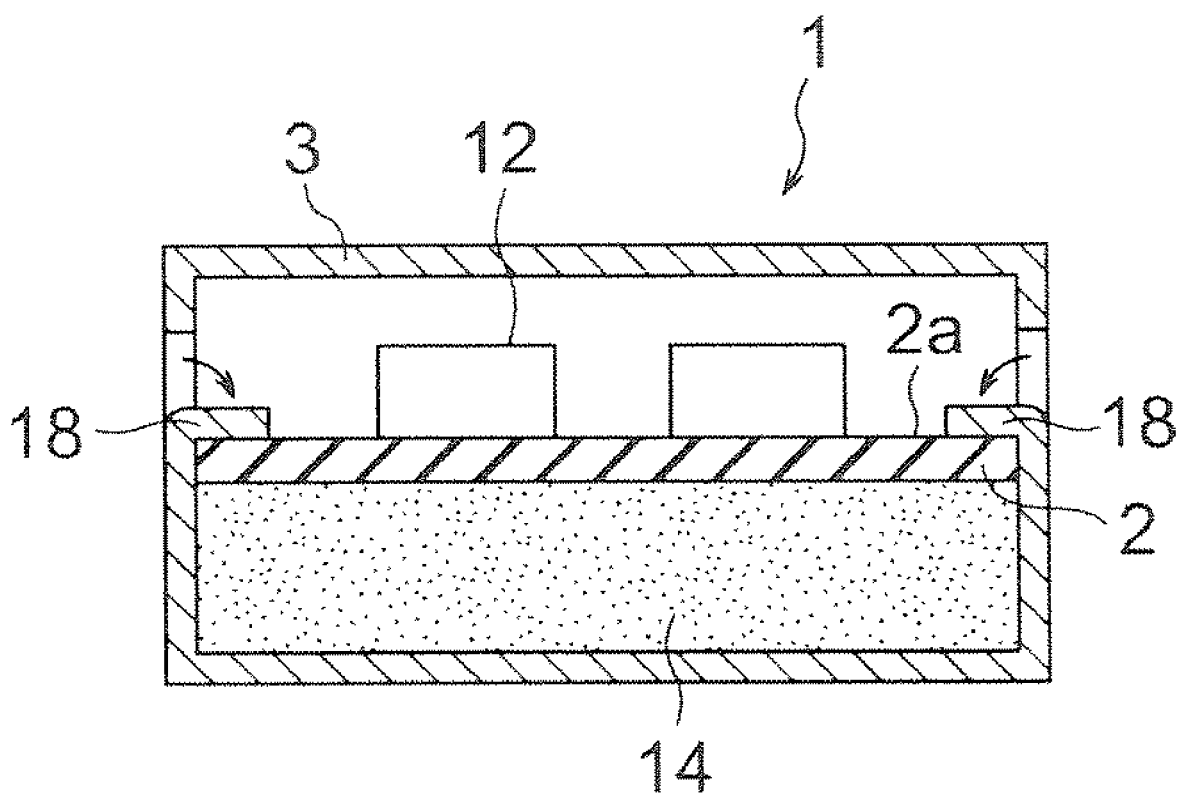
FIG. 11 is a sectional view of the USB memory device shown in FIG. 10 along a width direction.

As a move preventing mechanism of the USB memory main body 15 in the longitudinal direction, for example, mechanisms shown in FIGS. 10 and FIG. 11 can be applied. In the USB memory 1 shown in FIG. 10 and FIG. 11, parts of both side surfaces of the USB connector case 3 are cut in U-shape. These cut portions are folded toward the first principle surface 2a of the circuit board 2 after the USB memory main body 15 is inserted into the USB connector case 3. Projections 18 formed by folding the cut portions are in contact with the first principle surface 2a so as to press the circuit board 2. The movement of the USB memory main body 15 in the longitudinal direction can be prevented by the projections 18 as stated above.

Next, a USB memory according to a third embodiment is described with reference to FIG. 12 to FIG. 16. Here, in the above-stated second embodiment, the projection 16 of the USB connector case 3 is brought into contact with the electronic component 12 to suppress the movement forward of the USB memory main body 15. In this case, the electronic component 12 may be damaged by a pressing force of the projection 16 Besides, a rattling may occur in the USB memory main body 15 if a tolerance is considered not to press the projection 16 to the electronic component 12 too much. Further, when the projection 16 is brought into contact with the dummy component, a cost required for the dummy component becomes an increasing factor of the manufacturing cost.

Figure 12:
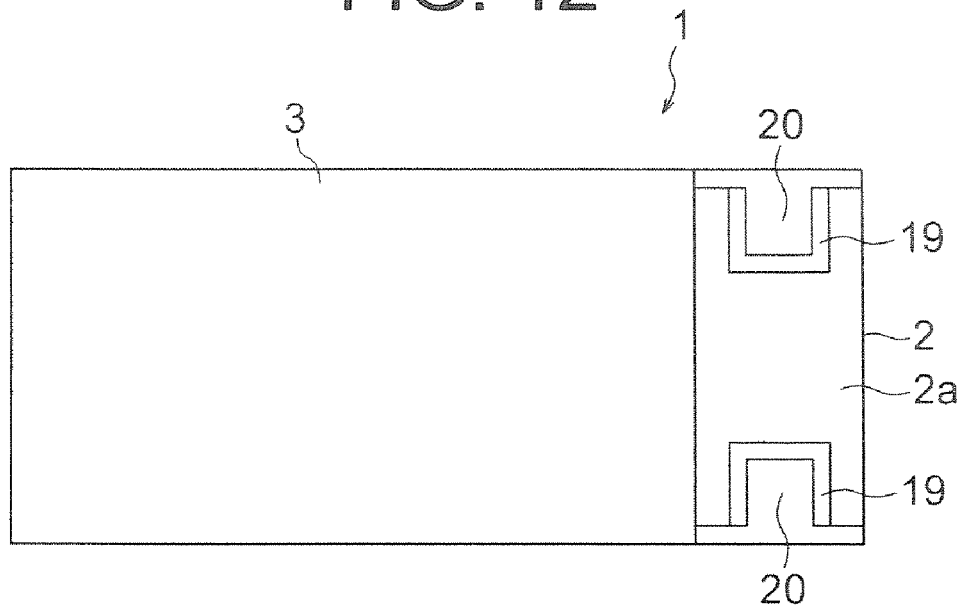
FIG. 12 is a plan view showing a constitution of a USB memory device according to a third embodiment of the present invention.
Figure 13:
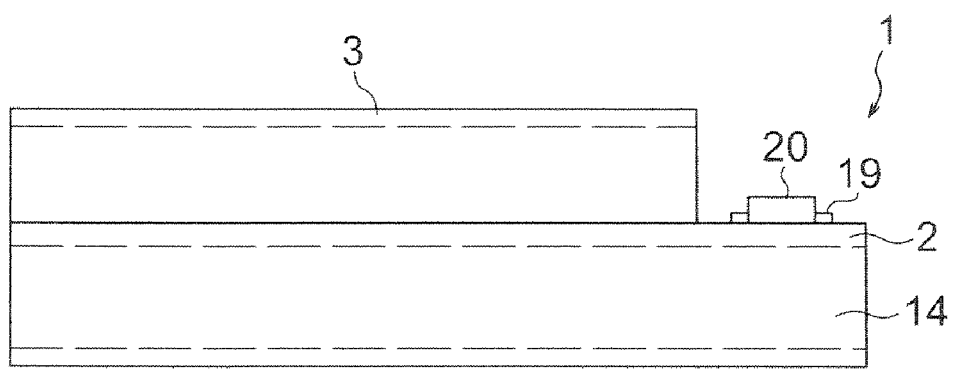
FIG. 13 is a side view of the USB memory device shown in FIG. 12.
Figure 14:
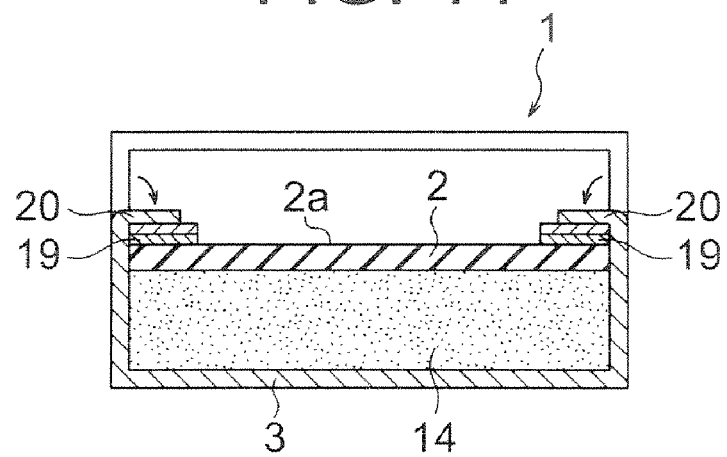
FIG. 14 is a sectional view of the USB memory device shown in FIG. 12 along a width direction.

Consequently, in a USB memory 1 according to the third embodiment, a part of a USB connector case 3 is solder joined with a land provided on a first principle surface 2a of a circuit board 2. For example, as shown in FIG. 12 to FIG. 14, lands 19 capable of solder mounting are provided at rear side end portions of the first principle surface 2a of the circuit board 2. On the other hand, the USB connector case 3 has claw portions 20 formed by cutting out rear sides thereof corresponding to positions of the lands 19.

The claw portions 20 of the USB connector case 3 are folded toward the lands 19 after the USB memory main body 15 is inserted into the USB connector case 3. The claw portions 20 folded toward the lands 19 have similar functions with the projections 18 in the second embodiment. The claw portions (projections) 20 of the USB connector case 3 are solder joined with the lands 19. As stated above, the circuit board 2 is solder joined with the USB connector case 3 via the lands 19. The movement of a USB memory main body 15 in forward and backward direction can be prevented by solder-joining the circuit board 2 with the USB connector case 3. Further, the movement of the USB memory main body 15 in longitudinal direction can also be prevented.

At this time, the land 19 may be made to be a ground electrode of the USB memory main body 15. Namely, the USB connector case 3 made of metal can be regarded as a part of a ground wiring by connecting the ground wiring of the USB memory main body 15 to the land 19. Herewith, it becomes possible to realize a simplification and so on of a wiring simultaneously with the move prevention of the USB memory main body 15. Further, damages on a memory element and a controller element caused by a static electricity and so on when handling them can be suppressed by making the USB connector case 3 the ground electrode.

The circuit board 2 solder joined with the USB connector case 3 can secure a height of a USB terminal 5 independent of, for example, a thickness of a sealing resin 14. Namely, when the thickness of the sealing resin 14 is reduced while considering a reduction of a material cost and an effective use of an existing molding die, a required terminal height cannot be secured. On the contrary, the height of the USB terminal 5 can be adjusted to the height of the USB connector independent of the thickness of the sealing resin 14 by providing the claw portions 20 of the USB connector case 3 at positions capable of securing the terminal height. Herewith, the manufacturing cost of the USB memory 1 can be reduced.

Figure 15:
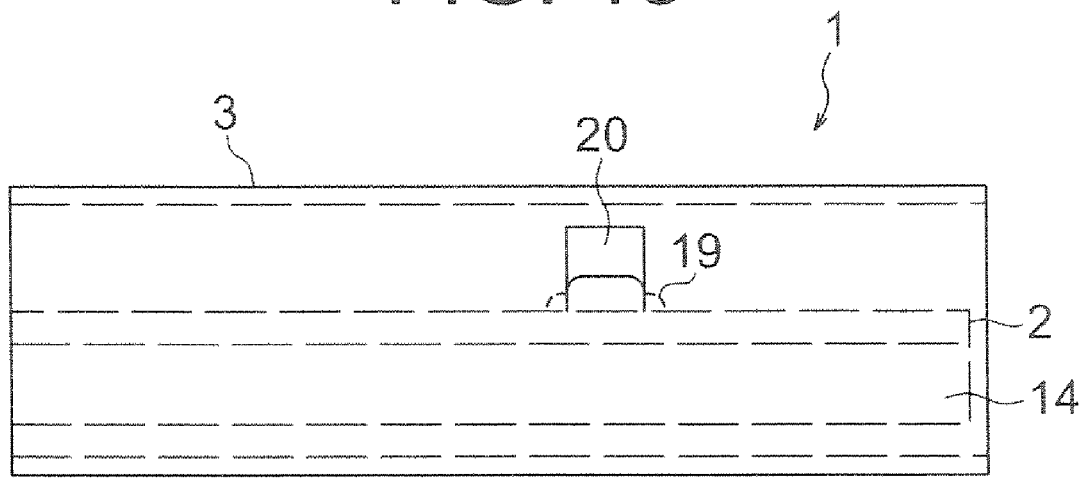
FIG. 15 is a side view showing another constitution of the USB memory device according to the third embodiment of the present invention.
Figure 16:
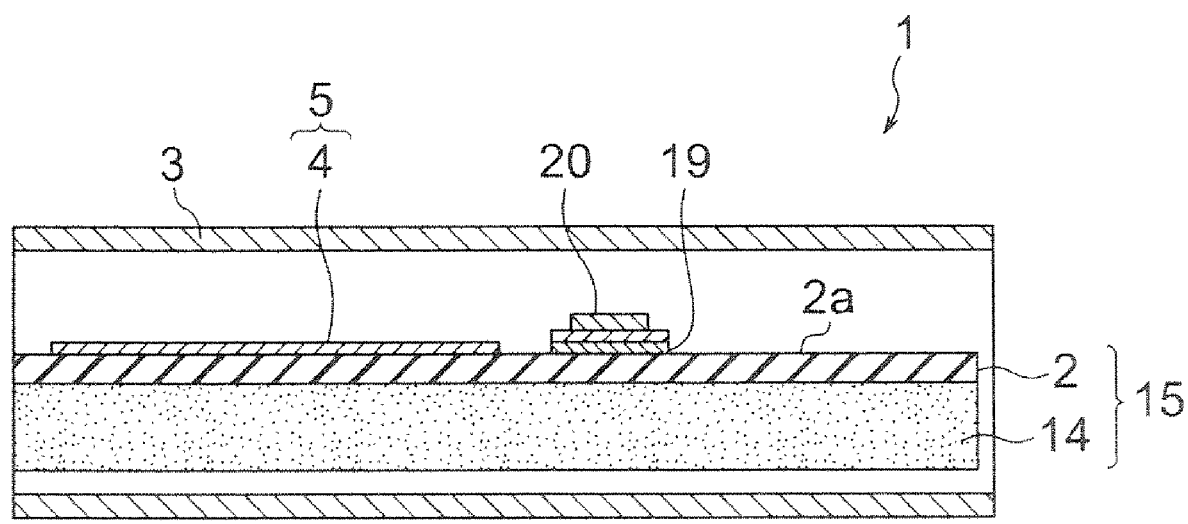
FIG. 16 is a sectional view of the USB memory device shown in FIG. 15.

The positions of the claw portion 20 of the USB connector case 3 may be in a vicinity of a center of the USB connector case 3 as shown in FIG. 15 and FIG. 16. The circuit board 2 is supported by the claw portion 20 provided in the vicinity of the center of the USB connector case 3, and thereby, a supporting intensity of the circuit board 2 is enhanced. Consequently, when the circuit board 2 is supported in a state floating from the USB connector case 3, a reliability of a supporting structure of the circuit board 2 can be enhanced. Such structure is effective when the height of the USB terminal 5 is adjusted by the circuit board 2 solder joined with the claw portion 20 of the USB connector case 3.

Next, a USB memory according to a fourth embodiment of the present invention is described with reference to FIG. 17 to FIG. 19. Here, in the above-stated third embodiment, the claw portions 20 of the USB connector case 3 are solder joined with the lands 19 provided at the circuit board 2. The claw portions (cut portions) 20 of the USB connector case 3 may be solder joined with the electronic component 12 mounted on the first principle surface 2a of the circuit board 2 without limiting to the land 19. The movements of the USB memory main body 15 in forward and backward direction and in longitudinal direction can also be prevented by the way stated above. The claw portions 20 are solder joined with at least on of the land 19 and the electronic component 12.

Figure 17:
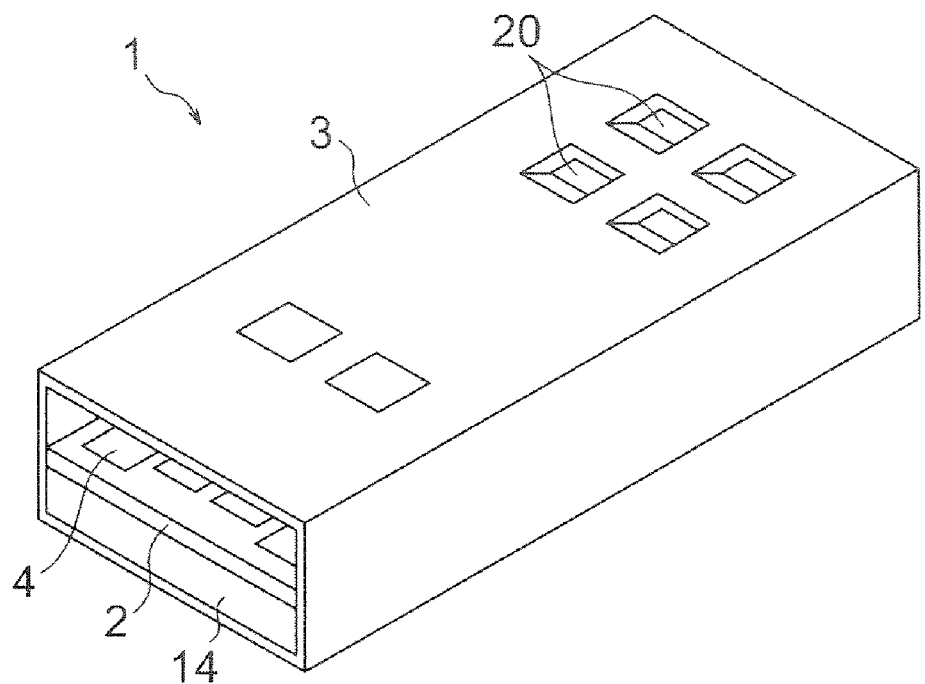
FIG. 17 is a perspective view showing a constitution of a USB memory device according to a fourth embodiment of the present invention.
Figure 18:
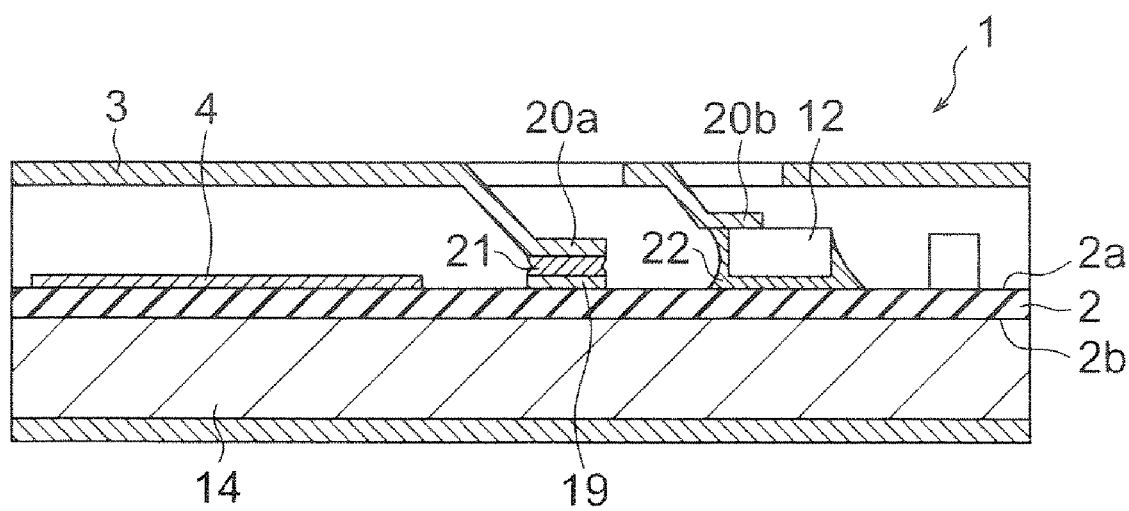
FIG. 18 is a sectional view of the USB memory device shown in FIG. 17.

In a USB memory 1 shown in FIG. 17 and FIG. 18, parts of an upper surface of a USB connector case 3 are cut in U-shape, and claw portions 20a, 20b are formed by folding the cut portions toward a first principle surface 2a of a circuit board 2. On the other hand, a land (ground electrode pad) 19 connected to a ground wiring of a USB memory main body 15 is provided on the first principle surface 2a of the circuit board 2. A solder fillet 21 is formed on the land 19 in advance. The solder fillet 21 for joining is supplied simultaneously with a solder fillet 22 for mounting an electronic component 12.

The claw portion 20a of the USB connector case 3 is joined with the land 19 having a function as a ground electrode via the solder fillet 21. Further, the other claw portion 20b is joined with the electronic component 12 mounted on the first principle surface 2a of the circuit board 2 via the solder fillet 22 for mounting. The claw portions 20a, 20b of the USB connector case 3 are joined with both the land 19 and the electronic component 12 provided on the first principle surface 2a of the circuit board 2. The movements of the USB memory main body 15 in forward and backward direction and in longitudinal direction are prevented by them, and the USB connector case 3 can be functioned as the ground wiring.

Figure 19A:
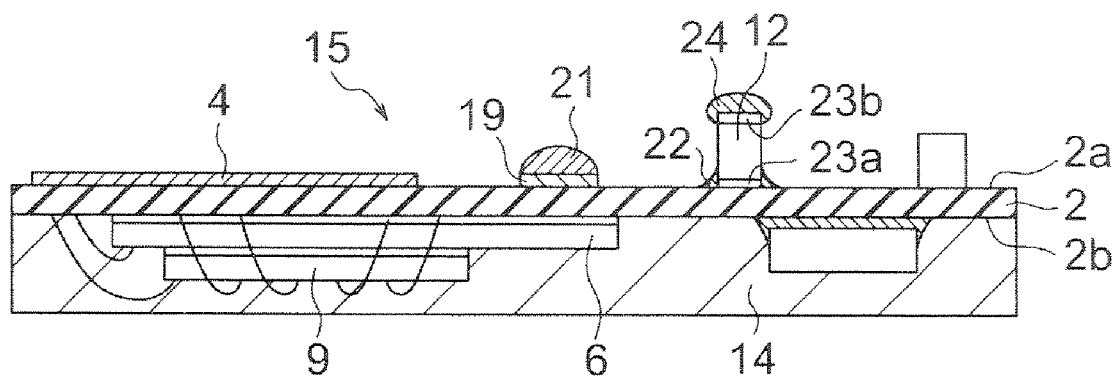
FIG. 19A and FIG. 19B are sectional views showing a constitution and a manufacturing process of a modification example of the USB memory device shown in FIG. 17.
Figure 19B:
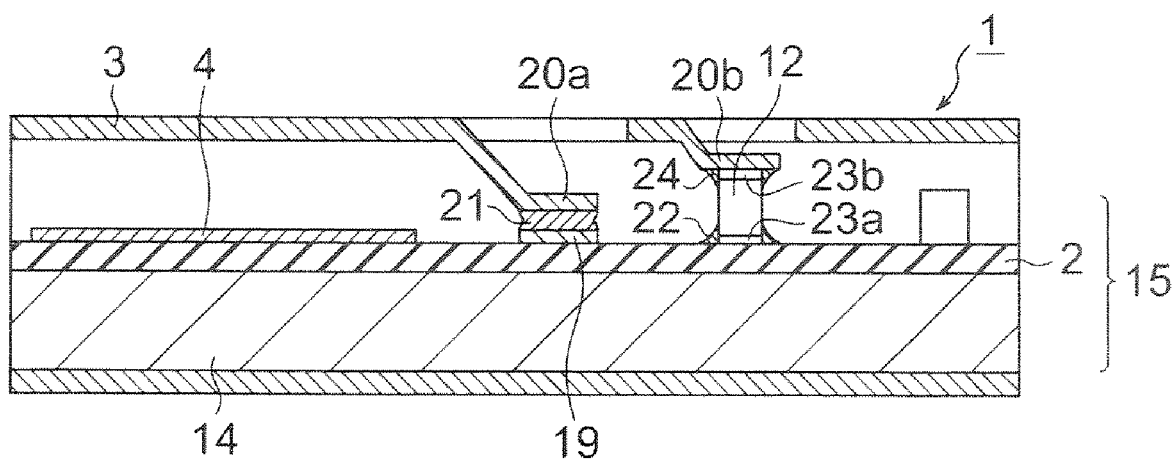

The claw portion 20 of the USB connector case 3 may be joined relative to an electrode 23 of the electronic component 12 as shown in FIG 19A and FIG. 19B. Namely, as shown in FIG 19A, the electronic component 12 to be joined with the claw portion 20b, is mounted by solder joining only one electrode 23a with the first principle surface 2a of the circuit board 2 A solder fillet 24 is formed on the other electrode 23b of the electronic component 12. Namely, the electronic component 12 is mounted in a perpendicular state while the electrode 23b is to be upward. The solder fillet 21 is formed also on the land 19.

The USB memory main body (semiconductor memory device) 15 as stated above is inserted into the USB connector case 3 as shown in FIG. 19B. The first claw portion 20a is connected to the land 19 via the solder fillet 21. The second claw portion 20b is connected to the electrode 23b of the electronic component 12 via the solder fillet 24. In the electronic component 12 having the electrodes 23a, 23b at both ends, only one electrode 23a is connected to the circuit board 2, and the other electrode 23b is connected to the USB connector case 3 functioning as the ground wiring.

By applying the mounting and connection mode of the electronic component 12 as stated above, a mounting pad (connection pad) of the electronic component 12 for the electrode 23b becomes unnecessary, and therefore, a component mounting area of the circuit board 2 can be reduced. Further, a move preventing effect of the USB memory main body 15 and a reinforcing effect of the ground wiring can be obtained as same as the USB memory 1 shown in FIG. 17 and FIG. 18. Consequently, it becomes possible to realize the miniaturization of the circuit board 2 and the simplification of the wiring in addition to obtaining the move preventing effect of the USB memory main body 15 and the reinforcing effect of the ground wiring. The electronic components 12 to be connected to the claw portions 20 of the USB connector case 3 may exist in plural.

Incidentally, the present invention is not limited to the above-stated respective embodiments, but it can be applied to a semiconductor memory device and a USB memory device in which a USB terminal is formed on one principle surface of a circuit board, and a memory element is mounted on a principle surface at an opposite side thereof. Such device may be included in the present invention. The embodiments of the present invention are to be understood that all the changes and modifications without departing from the range of the following claims are to be included therein.

What is claimed is:

1. A USB memory device, comprising:
a semiconductor memory device, including:
   a circuit board having a first principle surface and a second principle surface at an opposite side of the first principle surface;
   a USB terminal formed on the first principle surface of the circuit board, and having a conductor layer to be an input/output terminal of a USB connector;
   a memory element mounted on the second principle surface of the circuit board;
   a sealing resin provided on the second principle surface of the circuit board so as to seal the memory element; and
   an electronic component mounted on at least one of a region except a forming region of the USB terminal on the first principle surface of the circuit board and a region except a mounting region of the memory element on the second principle surface of the circuit board; and
a USB connector case to which at least a part of the semiconductor memory device is housed, having an upper wall facing with the first principle surface of the circuit board, a lower wall facing with the second principle surface of the circuit board, and side walls,
wherein the USB connector case has a projection projecting and folding a cut portion formed by cutting into a part of the upper wall toward the first principle surface of the circuit board, and being in contact with at least one of the first principle surface of the circuit board and the electronic component.

2. The USB memory device according to claim 1, wherein the semiconductor memory device further includes a controller element arranged on the second principle surface of the circuit board, and sealed with the sealing resin together with the memory element.

3. The USB memory device according to claim 2, wherein the controller element is stacked on the memory element.

4. The USB memory device according to claim 2, wherein the controller element is mounted on the second principle surface of the circuit board so as to be parallel arranged with the memory element.

5. The USB memory device according to claim 1, wherein the cut portion has a folding angle of an acute angle so that the projection projects in an oblique direction, and the projection is brought into contact with the electronic component.

6. The USB memory device according to claim 1, wherein the USB connector case is solder joined with at least one of a land provided on the first principle surface and the electronic component mounted on the first principle surface of the circuit board.

7. The USB memory device according to claim 6, wherein the USB connector case has a claw portion formed by cutting into a part thereof, and the claw portion is folded toward the circuit board and solder joined with at least one of the land and the electronic component.

8. The USB memory device according to claim 7, wherein the USB connector case has a first claw portion solder joined with the land connected to the ground wiring of the circuit board, and a second claw portion solder joined with an electrode of the electronic component.

9. A USB memory device, comprising:
a semiconductor memory device, including:
   a circuit board having a first principle surface and a second principle surface at an opposite side of the first principle surface;
   a USB terminal formed on the first principle surface of the circuit board, and having a conductor layer to be an input/output terminal of a USB connector;
   a memory element mounted on the second principle surface of the circuit board;
   a sealing resin provided on the second principle surface of the circuit board so as to seal the memory element; and
   an electronic component mounted on at least one of a region except the forming region of the USB terminal on the first principle surface of the circuit board and a region except the mounting region of the memory element on the second principle surface of the circuit board; and
a USB connector case to which at least a part of the semiconductor memory device is housed, having an upper wall facing with the first principle surface of the circuit board, a lower wall facing with the second principle surface of the circuit board, and side walls,
wherein the USB connector case has a projection projecting and folding a cut portion formed by cutting into a part of the side walls toward the first principle surface of the circuit board, and being in contact with at least one of the first principle surface of the circuit board and the electronic component.

10. The USB memory device according to claim 9, wherein the projection is brought into contact with the first principle surface of the circuit board.

11. The USB memory device according to claim 9, wherein the projection is solder joined with a land provided on the first principle surface of the circuit board.

12. The USB memory device according to claim 11, wherein the land is connected to a ground wiring of the circuit board, and the USB connector case constitutes a part of the ground wiring.

13. The USE memory device according to claim 9, wherein the semiconductor memory device further includes a controller element arranged on the second principle surface of the circuit board, and sealed with the sealing resin together with the memory element.

14. The USB memory device according to claim 13, wherein the controller element is stacked on the memory element.

15. The USB memory device according to claim 13, wherein the controller element is mounted on the second principle surface of the circuit board so as to be parallel arranged with the memory element.

16. A USB memory device, comprising:
a semiconductor memory device, including:
   a circuit board having a first principle surface and a second principle surface at an opposite side of the first principle surface;
   a USB terminal formed on the first principle surface of the circuit board, and having a conductor layer to be an input/output terminal of a USB connector;

a memory element mounted on the second principle surface of the circuit board; and a sealing resin provided on the second principle surface of the circuit board so as to seal the memory element; and a USB connector case to which at least a part of the semiconductor memory device is housed, having an upper wall facing with the first principle surface of the circuit board, a lower wall facing with the second principle surface of the circuit board, and side walls, wherein the USB connector case has a projection projecting and folding a cut portion formed by cutting into a part of the side walls toward the first principle surface of the circuit board, and being in contact with the first principle surface of the circuit board.

17. The USB memory device according to claim 16, wherein the projection is solder joined with a land provided on the first principle surface of the circuit board.

18. The USB memory device according to claim 17, wherein the land is connected to a ground wiring of the circuit board, and the USB connector case constitutes a part of the ground wiring.

19. The USB memory device according to claim 16, wherein the semiconductor memory device further includes a controller element arranged on the second principle surface of the circuit board, and sealed with the sealing resin together with the memory element.

20. The USB memory device according to claim 19, wherein the controller element is stacked on the memory element.

21. The USB memory device according to claim 19, wherein the controller element is mounted on the second principle surface of the circuit board so as to be parallel arranged with the memory element.

* * * * *